United States Patent
Takagi (10) Patent No.: US 9,153,020 B2
(45) Date of Patent: Oct. 6, 2015

(54) SEMICONDUCTOR DEVICE DEFECT INSPECTION METHOD AND SYSTEM THEREOF

(75) Inventor: Yuji Takagi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 128 days.

(21) Appl. No.: 14/119,138

(22) PCT Filed: Apr. 27, 2012

(86) PCT No.: PCT/JP2012/061317
§ 371 (c)(1),
(2), (4) Date: Feb. 18, 2014

(87) PCT Pub. No.: WO2012/160945
PCT Pub. Date: Nov. 29, 2012

(65) Prior Publication Data
US 2014/0198974 A1    Jul. 17, 2014

(30) Foreign Application Priority Data
May 20, 2011    (JP) ................................ 2011-112958

(51) Int. Cl.
*G06K 9/00* (2006.01)
*G06T 7/00* (2006.01)
*H01L 21/66* (2006.01)

(52) U.S. Cl.
CPC .............. *G06T 7/0008* (2013.01); *H01L 22/12* (2013.01); *H01J 2237/2817* (2013.01)

(58) Field of Classification Search
None
See application file for complete search history.

(56) References Cited

U.S. PATENT DOCUMENTS

| 7,071,011 B2 * | 7/2006 | Lin .................................. 438/5 |
| 7,355,693 B2 * | 4/2008 | Takeda et al. .............. 356/237.5 |
| 2008/0295048 A1 | 11/2008 | Nehmadi et al. |
| 2011/0187848 A1 * | 8/2011 | Choi et al. ...................... 348/92 |

FOREIGN PATENT DOCUMENTS

JP    2009-010286 A    1/2009

* cited by examiner

*Primary Examiner* — Daniel Mariam
(74) *Attorney, Agent, or Firm* — Miles & Stockbridge P.C.

(57) ABSTRACT

Provided are a semiconductor device defect inspection method and system thereof, with which predetermined hot spots are inspected using a SEM, and with which the frequency of defects occurring at the hot spot is estimated statistically and with reliability. An inspection point is designated in design data by the defect type. A plurality of pre-designated inspection points is selected by the defect type from the designated inspection points. The plurality of pre-designated inspection points by defect type thus selected are image captured by the inspection points. A defect ratio, which is a ratio of the plural inspection points which are image captured by the defect type to the plural defects detected, and a reliability interval of the defect ratio which is computed by the defect type is compared with a preset reference value. A defect type having a defect occurrence ratio which exceeds the reference value is derived.

12 Claims, 10 Drawing Sheets

DEFECT TYPE A

*FIG. 3*

DEFECT TYPE B

SEMICONDUCTOR DEVICE DEFECT INSPECTION METHOD AND SYSTEM THEREOF

BACKGROUND

The present invention relates to an appearance inspection in a pre-process for a semiconductor wafer, and, more particularly, to a semiconductor device defect inspection method and its system for inspecting points specified in advance and efficiently evaluating the situation of the defect occurrence.

Along with miniaturization of the circuit patterns of the semiconductor devices, the accuracy of the manufacturing method thereof has been increased. With this circumstance, a change is recognized also in defects to occur. That is, conventionally, dominant defects have been those defects which randomly occur due to dust, foreign substances, and the like. On the contrary, increasing defects are those defects which have a high design dependency correlating with alignment of the wiring or elements, or which occur due to the form of a particular layer (also called a layer) or the overlapping of layers. Those defects having a high dependency of circuit design are called "systematic defects". For example, the defects include a short of the transcription pattern and disconnection due to an optical proximity effect in an exposure process, a resistance anomaly, and a contact hole conduction failure. The resistance anomaly is caused by a change in the pattern form due to a difference in the base. The conduction failure is caused by insufficient etching of a gate oxide film in a particular area.

The circuit design has been made, not to cause occurrence of the systematic defects. However, some parts with less process margin remain as hot spots (positions in which defects are likely to occur due to a change in the process). The hot spot include not only a point which can be foreseen before manufacture through simulation, but also a point which is set as knowledge accumulated experimentally after manufacture. The systematic defects occurring at these hot spot may be prevented in many cases, by changing a part of manufacturing conditions. There is much demand on a function for determining the existence of defects occurred at hot spots, based on defects detected by the inspection device.

As a method for observing the systematic defects, Patent literature 1 discloses a method. In this method, an inspection image corresponding to a defect part and acquired through the appearance inspection is compared with imaged design data, and the circuit parts on the corresponding design data are specified and classified by circuit shape, thereby detecting the circuit shape which appears with high frequency.

Patent literature 2 suggests determining hot spots by matching the geometrical features of defects detected by an appearance inspection device with design data.

CITATION LIST

Patent Literature

Patent Literature 1: JP 2009-10286 A
Patent Literature 2: US 2008/0295048 A

The systematic defects occur depending on the positional relationship of the circuit design. The circuit design is made not to cause the systematic defects at the designing stage. However, to verify this at a stage of manufacturing the wafer, the wafer part or the entire surface is scanned and inspected, using an optical appearance inspection or a SEM appearance inspection device.

In the method disclosed in the literature cited, an accurate comparison with the design data is not possible, because the resolution of the inspection image is not high enough. In addition, the circuit shape corresponding to the detected defect position is not possibly specified accurately, for some reasons. The reasons include an error in the orientation of the coordinate system of the inspection device and the coordinate system of the design data, and also a deviation of the detected defect coordinate from the position coordinate of a systematic defect to be focused because it depends on a defect detection algorithm (for example, the center of gravity of a defect signal acquired from a difference between a defect image and a reference image). Therefore, a problem is that it is not possible to accurately evaluate the frequency of defects occurred at the hot spot.

In the method disclosed in Patent Literature 2, because the hot spot is determined by matching the geometric features of the defects detected by the appearance inspection device and the design data, the circuit shape corresponding to the detected defect position can not accurately be specified due to a deviation from the position coordinate of the systematic defect to be focused. Therefore, a problem is that it is not possible to evaluate the frequency of defects occurred at the hot spots.

SUMMARY

In consideration of the above problem, an object of the present invention is to provide a semiconductor device defect inspection method and its system, for inspecting hot spots which are set in advance using a high resolution SEM through a step-and-repeat procedure and estimating the defect occurrence frequency statistically at the hot spot with a high reliability.

To solve the above problem, according to the present invention, there is provided a semiconductor device defect inspection method comprising the steps of: specifying inspection points by a defect type on design data; selecting a pre-specified number of inspection points from the specified inspection points, by the defect type; imaging the pre-specified number of inspection points selected by the defect type, and detecting defects at the inspection points; calculating a defect ratio of the detected defects with respect to the number of inspection points imaged by the defect type and also a confidence interval of the defect ratio; comparing the confidence interval of the defect ratio calculated by the defect type with a preset reference value; and obtaining a defect type having a defect occurrence ratio exceeding the reference value.

To solve the above problem, according to the present invention, there is provided a semiconductor device defect inspection method comprising the steps of: specifying inspection points by a defect type on design data; selecting a pre-specified number of inspection points by the defect type from the pre-specified number of inspection points; imaging the selected pre-specified number of inspection points by the defect type, and detecting defects at the inspection points from an image of the inspection points; calculating a ratio of the defects calculated with respect to the number of inspection points imaged by the defect type; calculating a significant difference of the defect ratios calculated by the defect type; and obtaining a defect type having a significant difference in the defect ratio based on a calculation result.

To solve the above problem, according to the present invention, there is provided a semiconductor device defect inspection system, comprising: an inspection point specifying unit which specifies inspection points by a defect type on design data; an input unit which inputs a pre-specified number of inspection points from the inspection points specified by the inspection point specifying unit, by the defect type; an imaging unit which images the pre-specified number of inspection points by the defect type that are input by the input unit; an image processing unit which processes an image of the inspection points which is acquired by the imaging unit, and detects defects; an arithmetic unit which calculates a defect ratio as a ratio of number of defects by the defect type that are detected by the image processing unit with respect to number of inspection points by the defect type imaged by the imaging unit and also a confidence interval of the defect ratio by the defect type; a comparison unit which compares the confidence interval of the defect ratio calculated by the arithmetic unit by the defect type with a preset reference value; a defect type extracting unit which obtains a defect type having a defect ratio exceeding the reference value; and an output unit which outputs information regarding the defect type obtained by the defect type extracting unit.

To solve the above problem, according to the present invention, there is provided a semiconductor device defect inspection system comprising: an inspection point specifying unit which specifies inspection points by a defect type on design data; an input unit which inputs a pre-specified number of inspection points by the defect type, from the inspection points specified by the inspection point specifying unit; an imaging unit which images the pre-specified number of inspection points by the defect type that are input by the input unit; an image processing unit which processes the image of the inspection points imaged by the imaging unit, and detects defects; an arithmetic unit which calculates a defect ratio as a ratio of number of defects, by the defect type, detected by the image processing unit with respect to number of inspection points by the defect type imaged by the imaging unit and also a confidence interval of the defect ratio by the defect type; a significant difference calculating unit which calculates a significant difference of defect ratios by the defect type calculated by the arithmetic unit; a defect type extracting unit which obtains a defect type having a significant difference in the defect ratios, based on a calculation result by the significant difference calculating unit; and an output unit which outputs information regarding the defect type obtained by the defect type extracting unit.

According to the present invention, a solution for quickly changing the manufacturing condition is possible, because it is possible to efficiently evaluate the frequency of defects occurred at hot spots of the circuit pattern formed on a semiconductor wafer in a pre-process of the semiconductor-device manufacturing with a high reliability.

These features and advantages of the invention will be apparent from the following more particular description of preferred embodiments of the invention, as illustrated in the accompanying drawings.

DESCRIPTION OF THE PREFERRED EMBODIMENT

An embodiment of the present invention will now be described using the accompanying drawings.

Figure 1:
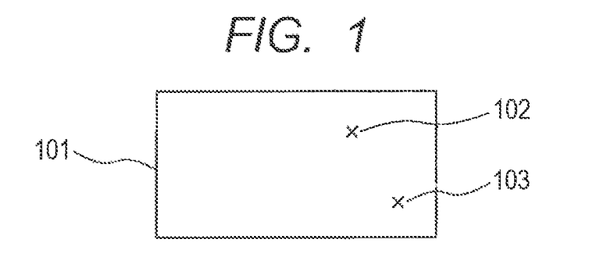
FIG. 1 is a plan view illustrating a configuration of a schematic inspection target chip.
Figure 2:
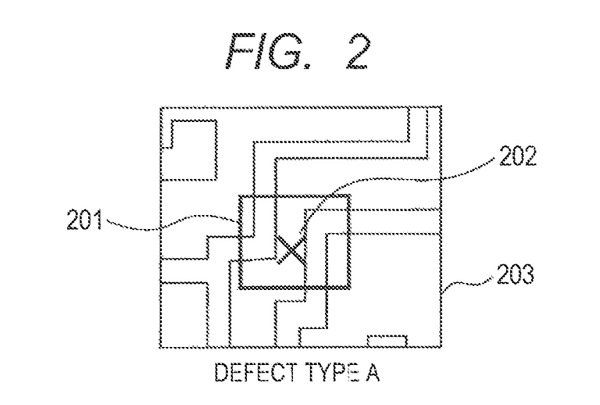
FIG. 2 is a diagram illustrating an example of an enlarged image of an area including a defect type A.
Figure 3:
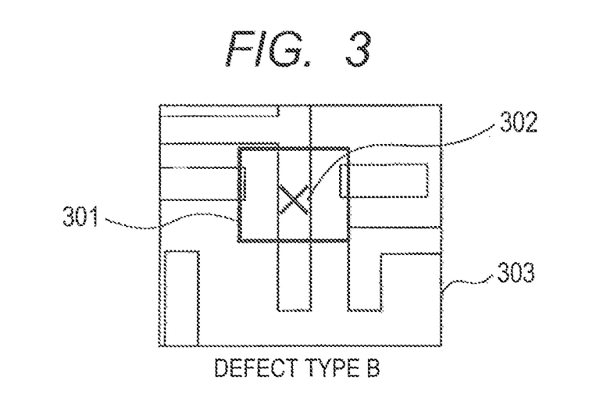
FIG. 3 is a diagram illustrating an example of an enlarged image of an area including a defect type B.
Figure 4:
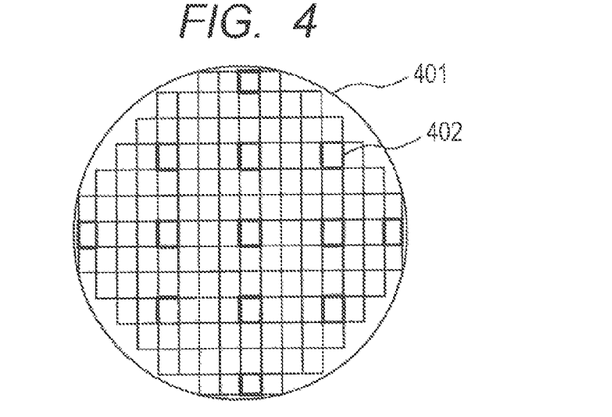
FIG. 4 is a diagram illustrating an example of a wafer map including an inspection target chip.
Figure 5:
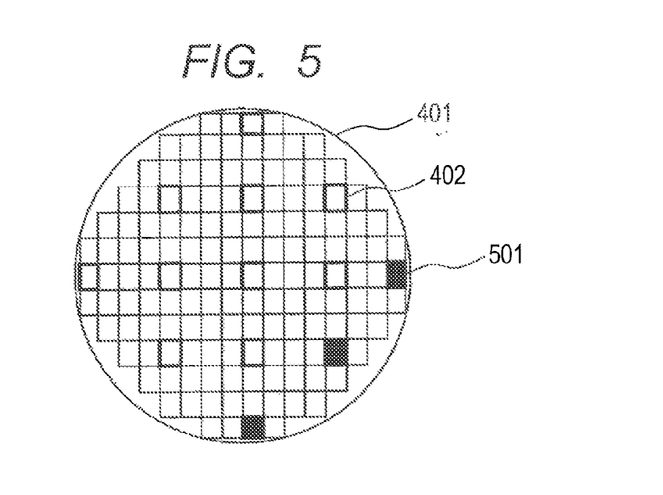
FIG. 5 is a diagram illustrating an example of a wafer map showing a defect determination result.

In this embodiment, FIG. 1, FIG. 2, and FIG. 3 illustrate an example of a target defect, and FIG. 4 and FIG. 5 illustrate the state of inspection. In FIG. 1, "101" represents a chip (hereinafter referred to as a semiconductor chip) formed on a semiconductor wafer. Many circuit patterns are formed inside the semiconductor chip 101. In the configuration illustrated in FIG. 1, those circuit patterns are not illustrated. "102" and "103" represent some places where defects are likely to be present due to a change in a process, that is, hot spots. An enlarged image 203 of the hot spots 102 is illustrated in FIG. 2, while an enlarged image 303 of the hot spot 103 is illustrated in FIG. 3. Other than the point illustrated as the hot spot 102 in the semiconductor chip 101, there are the same parts as those in the circuit shape illustrated in FIG. 2. However, in FIG. 1, only the hot spot 102 is simply illustrated for the sake of easy description. The same shall apply to the hot spot 103.

"201" of FIG. 2 represents a "short defect occurrence estimated area" as an inspection area, and is a part having a possibility that a pattern short is likely to occur due to the circuit shape in this part. A point 202 is a center coordinate position of the short defect occurrence estimated area 201, and the point 202 is controlled to be positioned at the center of the short defect occurrence estimated area 201 as an inspection field. "301" of FIG. 3 represents a "disconnection defect occurrence estimated area" as an inspection area, and is a part having a possibility that a pattern disconnection is likely to occur from the circuit shape in this part. A point 302 is the center coordinate of the disconnection defect occurrence estimated area 301, and is a point which is controlled to be positioned at the center of the disconnection defect occurrence estimated area 301, as an inspection area.

As illustrated in FIG. 2 and FIG. 3, different kinds of defects to be occurred are estimated. In FIG. 2, the defect estimated to occur in the short defect occurrence estimated area 201 as the inspection area is called a "defect type A". In FIG. 3, the defect estimated to occur in the disconnection defect occurrence estimated area 301 as the inspection area is called a "defect type B". Though not illustrated, in addition to these, if there is any estimated defect type to occur, defect type codes are assigned as a defect type C and a defect type D.

"401" of FIG. 4 represents a wafer map schematically showing an inspection target wafer and semiconductor chips manufactured thereon. A semiconductor chip 402 illustrated with a black frame is an inspection target semiconductor chip (hereinafter referred to as an inspection target chip). As illustrated in FIG. 4, the inspection target chip (s) 402 may selectively be selected, or the entire chips may be selected.

FIG. 5 is a diagram illustrating an output display form of this embodiment, a diagram illustrating inspection target chips 501 having the number of defects which is equal to or greater than a reference value corresponding to the defect type A, as an inspection result of the inspection target chips 402 illustrated in FIG. 4, or a diagram example illustrating the inspection target chips 501 of the defect type A and having the defect more frequently than other defect types, as the inspection result of the inspection target chips 402 illustrated in FIG. 4.

Figure 6:
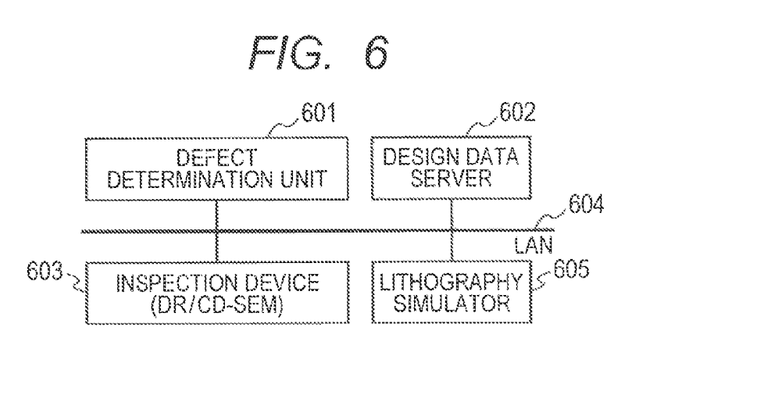
FIG. 6 is a block diagram illustrating a configuration of a schematic defect inspection system according to an embodiment of the present invention.

Descriptions will now be made to a calculation of a reference ratio, using FIG. 6 to FIG. 14. FIG. 6 is a general view including a defect determination system as the present invention, and a related device and system. A defect determination unit 601, a design data server 602 managing design data, an inspection device 603, and a lithography simulator 605 are connected to a LAN 604. The inspection device 603 includes a SEM device, such as a defect review SEM device or a length measurement SEM device, which perform a SEM inspection of wafers, through a step-and-repeat procedure. The lithography simulator 605 is not limited to this lithography simulator, and may not be necessary.

Figure 7:
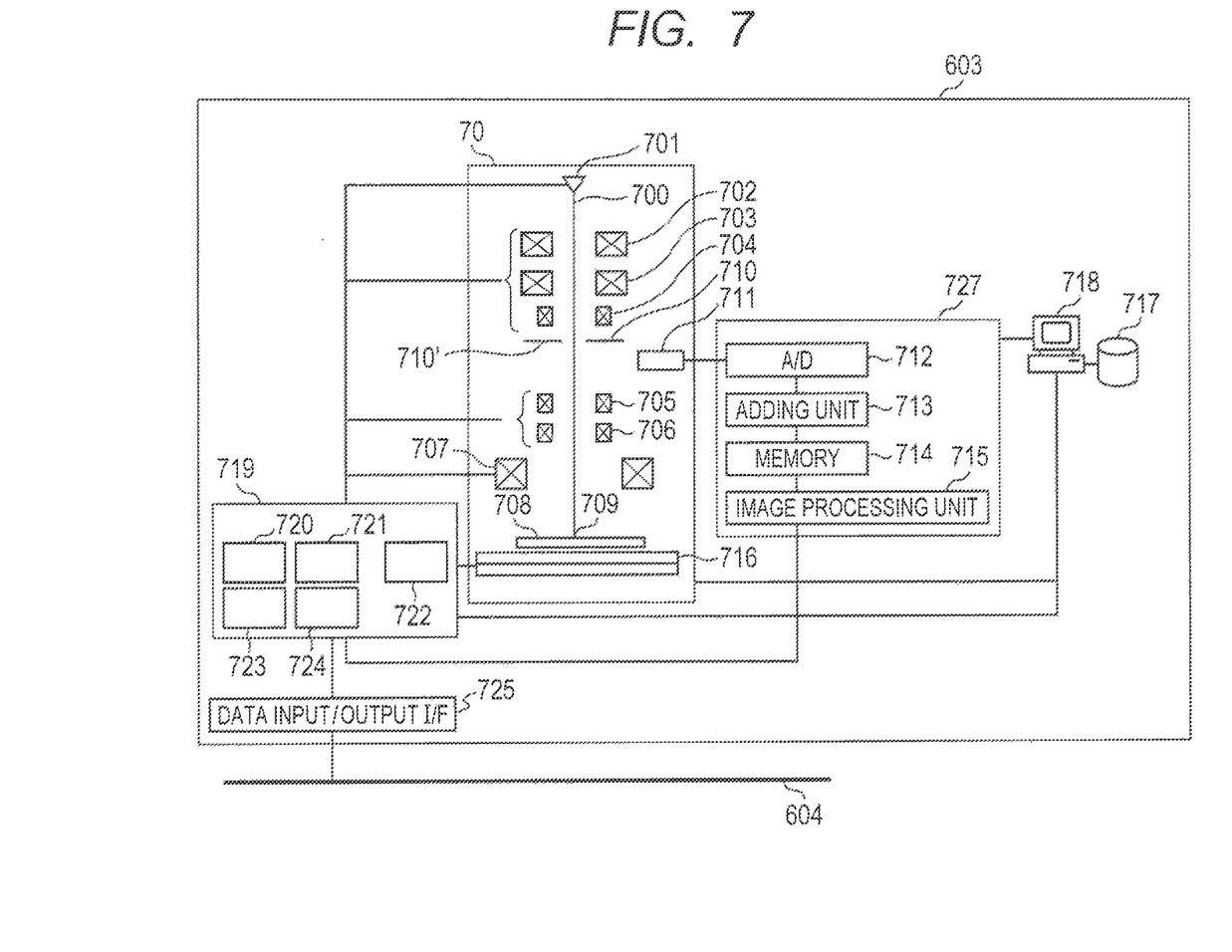
FIG. 7 is a block diagram illustrating a schematic configuration of an inspection device in the defect inspection system according to the embodiment of the present invention.

FIG. 7 illustrates a configuration of the inspection device 603 including the SEM. The inspection device 603 including the SEM is composed of a SEM device body 70, an overall control system 719, a data input/output I/F 725, an image processing system 727, a secondary storage device 717, and a computer 718.

The SEM device body 70 includes an electron optical system and a detection system, as follows. "701" represents an electron source, and emits an electron beam 700. After the emitted electron beam 700 passes through electron lenses 702 and 703, its astigmatism or misalignment is corrected by an electron beam axis adjuster 704. "705" and "706" represent two stages of deflectors which deflect the electron beam 700 to scan a wafer 708. The electron beam 700 is converged by an objective lens 707, and then focused on an imaging target area 709 of the wafer 708. As a result of this, secondary electrons and reflection electrons are generated from the imaging target area 709. The secondary electrons and the reflection electrons collide with a reflection plate 710 having a primary electron beam passage hole 710'. Then, the generated secondary electrons are detected by an electron detector 711.

The secondary electrons and the reflection electrons detected by the detector 711 are converted into a digital signal by an A/D converter 712, and are stored in a memory 714. An adding unit 713 is arranged between the A/D converter and a memory. When the electron beam 700 is raster-scanned onto the imaging target area 709, the adding unit 713 obtains averaging (frame addition) of the detected signals acquired in the same beam irradiation position. This enables to reduce the shot noise, and acquire an image signal with a high S/N ratio. "715" represents an image processing unit which detects defects using the image stored in the memory 714. "727" represents an image signal processing system. "716" represents an XY stage, allows the wafer 708 to move, thereby imaging an image in an arbitrary position of the wafer 708.

The secondary storage device 717 can store images stored in the memory 714. Abnormal parts of the inspection target area 709 which is acquired through the imaging process and the appearance features thereof can also be stored in the memory 714. The computer 718 includes an arithmetic device, a storage device, a display device, and an input device, and can also display images stored in the secondary storage device 717 or the memory 714. The user inputs information through the terminal 718, thereby it is possible to control and set operations of the SEM device body 70, the image processing system 727, and the overall control system 719, illustrated in FIG. 1.

The overall control system 719 includes a current amount control unit 720 of the electron source 701 of the electron beam 700, a deflection control unit 721 which controls the deflectors 705 and 706, an electron lens control unit 722 which controls the electron lenses 702, 703, 704, and 707, a stage control unit 723 which controls scrolling in accordance with the movement of the XY stage 715, and a sequence control unit 724 which controls the overall inspection sequence. The data input/output I/F 725 receives inspection point coordinate data from the LAN 604, and stores the received data in a memory (not illustrated) inside the sequence control unit 724.

The inspection device 603 moves the XY stage 715 using the stage control unit 723, based on the inspection coordinate data stored in the memory (not illustrated) inside the sequence control unit 724, detecting an electron beam image after the movement, and processes the detected electron beam image through the image processing unit 715, thereby determining whether a defect exists in the inspection coordinate point.

Figure 8:
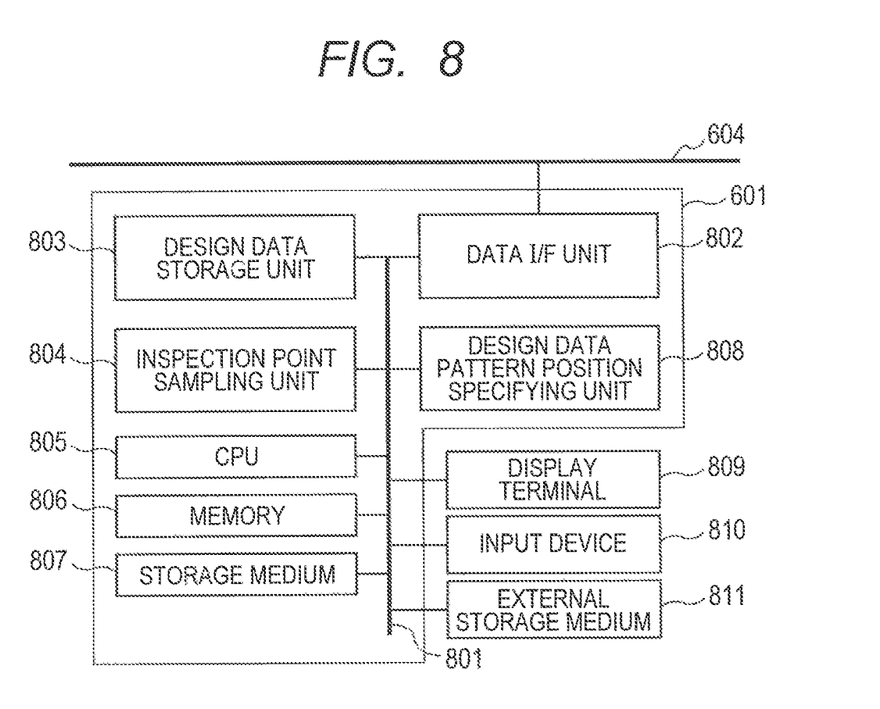
FIG. 8 is a block diagram illustrating a schematic configuration of a defect determination unit in the defect inspection system according to the embodiment of the present invention.

FIG. 8 is a block diagram of a defect determination unit 601. Data transmission/reception to/from the LAN 604 is performed using a data I/F unit 802, and inside data transmission is performed through a bus 801. The bus 801 is connected to a design data storage unit 803, an inspection point sampling unit 804, a CPU 805, a memory 806, a storage medium 807 (hard disk or non-volatile memory), and a design data pattern position specifying unit 808. It is also connected externally to a display terminal 809 and an input device 810 (for example, keyboard) for inputting numerical data or specifying data. It may also be connected externally to an external storage medium 811, such as a hard disk, a non-volatile memory, a CD-ROM.

Figure 9:
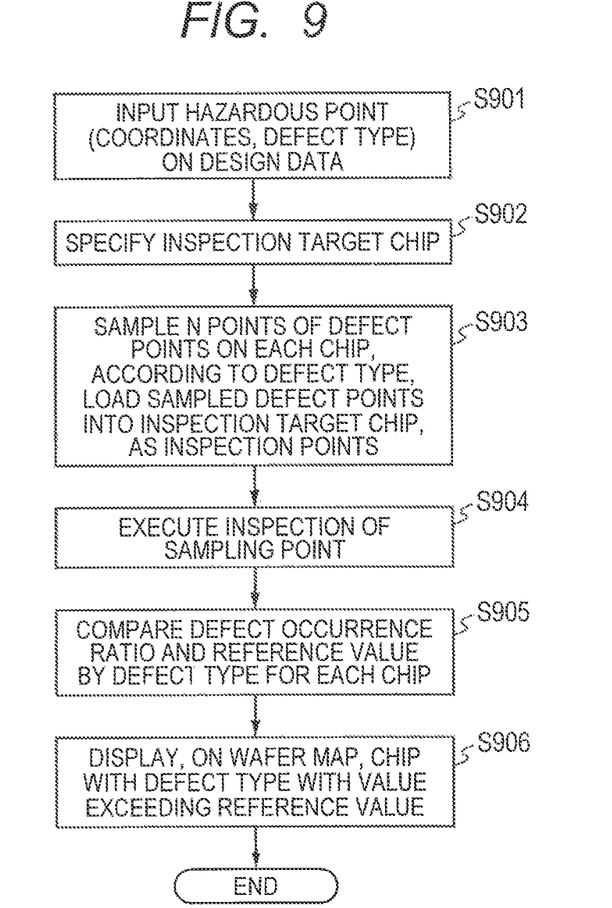
FIG. 9 is a flow diagram illustrating the flow of a schematic process in a defect inspection method according to the embodiment of the present invention.

FIG. 9 is a schematic flow of defect determination. A hot spot, as an inspection position, on the design data is input from the design data server 602 to the design data pattern position specifying unit 808 through the data I/F unit 802 and LAN 604 (S901). The hot spot information includes position coordinates of the hot spot on the wafer and an estimated defect type code. The hot spot information includes a result of lithography simulation using design data, for example, lithography simulation for the hot spot, and is input from the lithography simulator 605. Information obtained from the simulation corresponding to hot spot is not limited to lithography simulation, and any other simulation is possible as long as the coordinate of the hot spot and the defect type code can be acquired through the simulation. Alternatively, the hot spot is manually input by the defect type on the design data. The form of the design data registered by the defect type is set as a template, and a plurality of or all of positions corresponding to the design data with the same shape are searched out from one chip or an area necessary for inspection. Then, the searched position coordinates by the defect type may be set as hot spot information together with the defect type code.

When the result of the lithography simulation is used as hot spot information, the information is set from the lithography simulator 605 to the defect determination unit 601 through the LAN 604, as illustrated in FIG. 6. The sent hot spot information is stored in the design data storage unit 803 in association with the defect type, through the data I/F unit 802. When the hot spot is manually input by the defect type on the design data, design data of an inspection target layer is forwarded to the defect determination unit 601 from the design data server 602 through the LAN 604, as illustrated in FIG. 6. The forwarded design data is stored in the design data storage unit 803 through the data I/F unit 802. The manual instruction of the hot spot on the design data is achieved by specifying imaged design data on the display terminal 809, and inputting a hot spot position and a defect type code on the design data using the input device 810. The input design data is used as a template, and the design data pattern position specifying unit 808 searches out a plurality of or all of positions corresponding to the design data stored in the design data storage unit 803. Then, the searched information is stored in the design data storage unit 803 together with the defect type code as hot spot information.

An inspection target chip is now specified (S902). As illustrated with "402" of FIG. 4, the inspection target chip is a chip which is actually inspected, of chips created on the wafer. This specification may be done by the defect determination unit 601 or by the inspection device 603.

A predetermined number of points (referred to as "N") by the defect type are sampled by the inspection point sampling unit 804, as inspection points, from hot spot information stored in the design data storage unit 803. This causes to set the inspection points by the defect type for one chip, thus loading the inspection points into the entire points of the inspection target chips by the inspection point sampling unit 804 (S903). The loading into the entire points of the chips is performed by a device which has specified an inspection target chip, that is, the defect determination unit 601 or the inspection device 603. When the loading of the inspection points into the entire points of the chips is performed by the defect determination unit 601, the sampled hot spot information (that is, inspection point information) is temporarily stored on the storage medium 807. Then, the stored inspection point information is transferred from the data I/F unit 802 to the inspection device 603 through the LAN 604.

In the inspection device 603, the transferred inspection point information is stored in a memory (not illustrated) in the sequence control unit 724, through the data input/output I/F 725. When the loading of the inspection points into the entire points of the chips is performed by the inspection device 603, the sampled hot spot information (that is, inspection point information) by the defect type for one chip is received from the defect determination unit 601, and the inspection point information is loaded using inspection target chip information input from the computer 718 and stored in a memory (not illustrated) in the sequence control unit 724. The CPU 805 controls the defect determination unit 601 entirely.

Now, inspection is executed in accordance with the inspection point information stored in a memory (not illustrated) in the sequence control unit 724, to obtain an inspection result of the inspection points (S904).

With the inspection result, calculation is made to obtain the defect ratio for the number N of sampling points, in association with each chip and the defect type. Comparisons are made between the number of sampling points (described later) with a preset reference value, between the defect ratio and a preset reference value, and between the confidence interval calculated using them and a preset reference value (S905). As a result of comparison, a chip corresponding to a defect type exceeding the reference value is specified, and then displayed in the form of a wafer map as illustrated, for example, in FIG. 5, on the display terminal 809 (S906).

Figure 10:
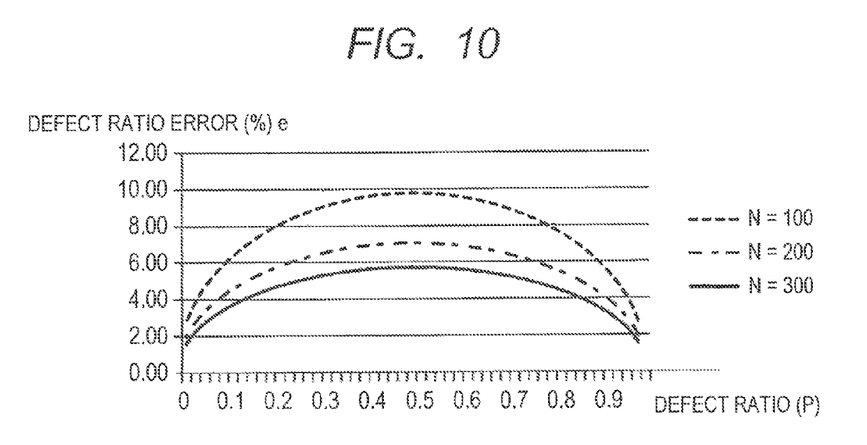
FIG. 10 is a graph illustrating the relationship between a defect ratio and a defect ratio error, for explaining a confidence interval.
Figure 11:
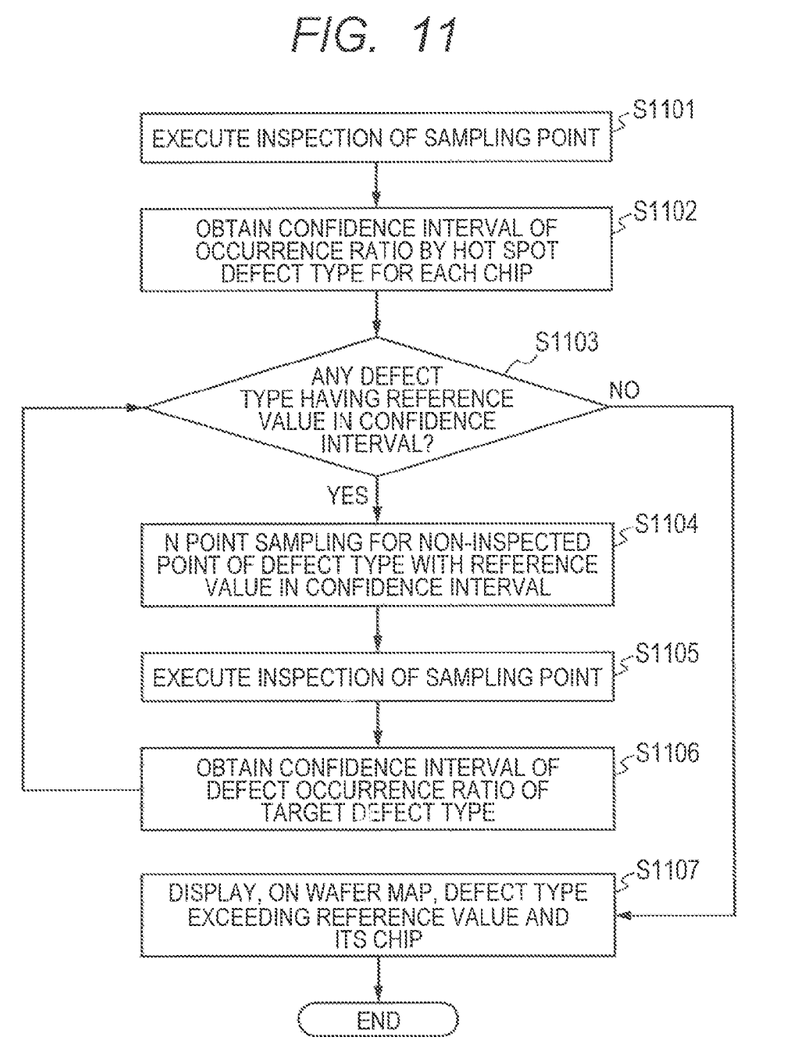
FIG. 11 is a flow diagram illustrating the specific flow of a process from S904 to S906 in the process flow diagram illustrated in FIG. 9.
Figure 12:
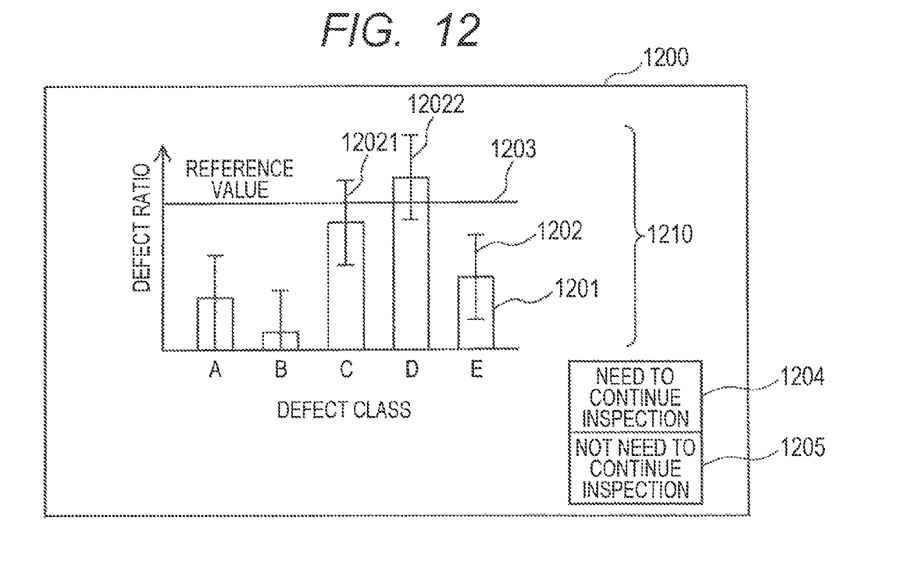
FIG. 12 is a front view of a GUI screen in which a bar chart shows defect occurrence ratios by defect type, halfway through the inspection.
Figure 13:
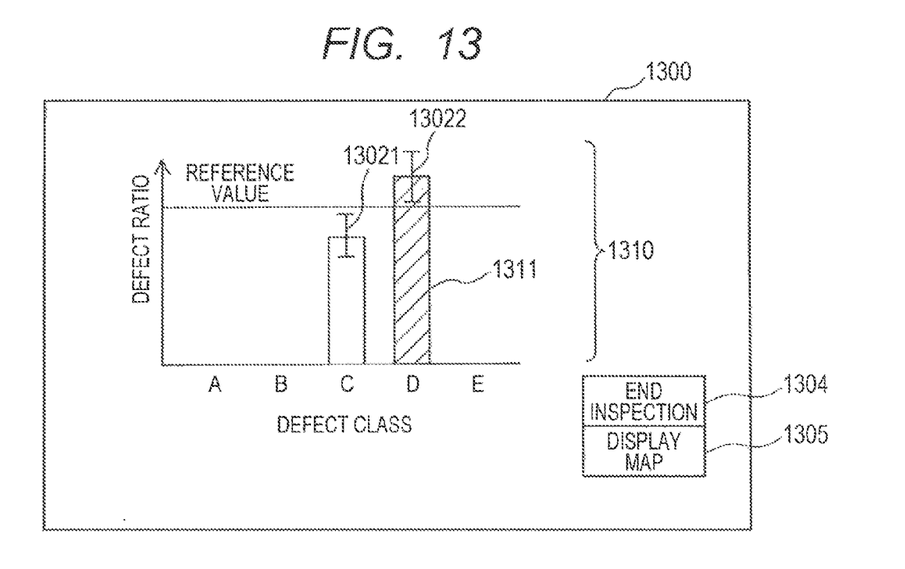
FIG. 13 is a front view of a GUI Screen in which a bar chart shows defect occurrence ratios by defect type at the completion of inspection.

FIG. 10 illustrates an idea of the confidence interval used in FIG. 11, FIG. 12, and FIG. 13. The inspection points of N points are inspected, and the defect ratio as a ratio of determined defects thereof is set as "P". In this case, the estimated variance S is S=sqrt (P*(1−P)/N) (sqrt (X) represents the square root of "X"). Based on the table of standard normal distribution, in case the reliability is α=95%, the distribution range of "P" is [P−1.96*S, P+1.96*S]. Thus, the error "e" (estimated error of population rate) is e=1.96*S=1.96*sqrt (P*(1−P)/N). FIG. 10 illustrates the transition of the defect ratio and the error "e", when the numbers N of defect samplings are 100, 200, and 300. In FIG. 10, the defect ratio P is plotted along the horizontal axis and the error "e" is plotted along the vertical axis. For example, when defects of 10 points are found among 100 inspection points (defect ratio 0.1=100), an error is approximately 6%. That is, its true ratio is present with a 95% degree of reliability in a range of 10±6%. This interval of P±e is called a confidence interval. By using "e" acquired with the reliability α=95%, the obtained defect ratio and a reference value "TH" are compared. If "TH<P−e", it can be determined that the defect ratio exceeds the reference value with the reliability of 95%. If P+e<TH, it can be determined that the defect ratio is lower than the reference value with the reliability of 95%. When the determination can be required with the reliability of 95%, it cannot be determined whether "P" is greater or lower than the reference value "TH", if "P−e≤TH≤P+e". In other words, defect determination is not possibly made. The reliability α is a numeral which can be set arbitrarily, and the above calculation may be performed again from the table of standard normal distribution in accordance with the numeral.

FIG. 11 to FIG. 14 illustrate specific steps of inspection. The specific flow of FIG. 11 corresponds to procedures from and after S904 of FIG. 9. A reference value (a threshold value) is set in advance the inspection for a defect ratio to be acquired in the inspection. First, the sampled inspection points are inspected (S1101; corresponding to S904). After this inspection, the confidence interval of the defect ratio is calculated by chip and the defect type (S1102). Next, an evaluation is made as to whether a reference value is present inside the confidence interval by the defect type of each chip (S1103).

FIG. 12 is a diagram illustrating an example of a GUI 1200 which performs graph display 1210 displaying a bar chart 1202, wherein a confidence interval is included in a bar chart 1201 of each of the defect types A, B, C, D, and E in a chip in the middle of the inspection. In this example, a reference value 1203 is within confidence intervals 12021 and 12022. It is not possible to determine the defect with a predetermined reliability α. In this manner, a defect type which is not possible to determine the defect is searched by the defect type classified by the chip, and N points of sampling points, which number is set in advance, are sampled from non-inspected points in a defect type classified by the chip (S1104), and an inspection is executed (S1105).

As a result of inspection, a determination is made as to whether the sampling needs to be executed again. When determined that the sampling needs to be executed, procedures from S1103 to S1106 are executed. On the GUI screen 1200, a button 1204 "need to continue inspection" and a button 1205 "not need to continue inspection" are displayed. The operator clicks on either button, to select between the execution of the sampling again and going forward to the next step upon completion of the inspection. When the sampling is performed again, the number N of sampling points is not necessarily the same as the number of sampling points at the first time. As a result of re-inspection, calculation is made for the confidence interval of the defect occurrence ratio, in association with the defect type of the corresponding chip (S1106; the above S1102 to S1106 corresponding to S905), and a comparison is made between the confidence interval and the reference value again (S1103).

As a result of this, as illustrated on a GUI screen 1300 of FIG. 13, in the corresponding defect types C and D exemplarily illustrated on the GUI screen 1200 of FIG. 12, a reference value is not included in each of confidence intervals 13021 and 13022, and a defect determination may be made with the reliability α. In this case, it forwards to a procedure of outputting a result of the defect determination (S1107; corresponding to S906). The GUI screen 1300 displays a graph 1310, displays a defect type (defect type D: 1311, in the example of FIG. 13) exceeding a reference value, and turns on a display 13041 of "end inspection". If a map display button 13042 on this GUI screen 1300 is clicked, the display is switched to a GUI screen 1400 illustrated in FIG. 14.

Figure 14:
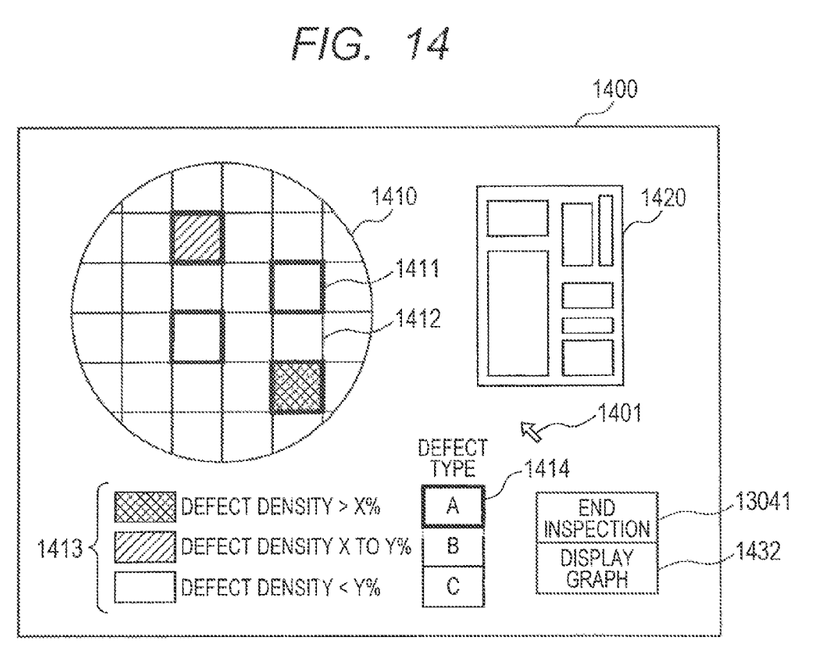
FIG. 14 is a front view of a GUI screen in which a wafer map shows defect occurrence ratios by defect type at the completion of inspection.

On the GUI screen 1400, an inspected chip 1411 is displayed on a wafer map 1410 and distinguished from a non-inspected chip 1412 thereon. Regarding the inspected chip 1411, displayed information includes information 1413 about classes corresponding to the detected defect density and information 1414 about the defect types of the displayed defects.

FIG. 14 illustrates a state of the defect density of each chip regarding defect type A. A cursor 1401 is moved to and clicked on a position of defect type B, thereby displaying a state of the defect density of each chip regarding the defect type B on the wafer map 1410. If the cursor 1401 is moved to and clicked on one chip displayed on the wafer map 1410, an enlarged image 1420 is displayed on the clicked chip. If the cursor 1401 is moved to and clicked on a button "display graph" 1432, the display is switched to the GUI screen 1300 of the graph display illustrated in FIG. 13. If the defect determination is not performed, procedures from and after S1104 are repeated until the defect determination is possible.

The output result of S1107 is not limited to the form of the wafer map, the output may be made in any form as long as it is possible to understand the defect type exceeding the reference value and its chip.

Figure 15:
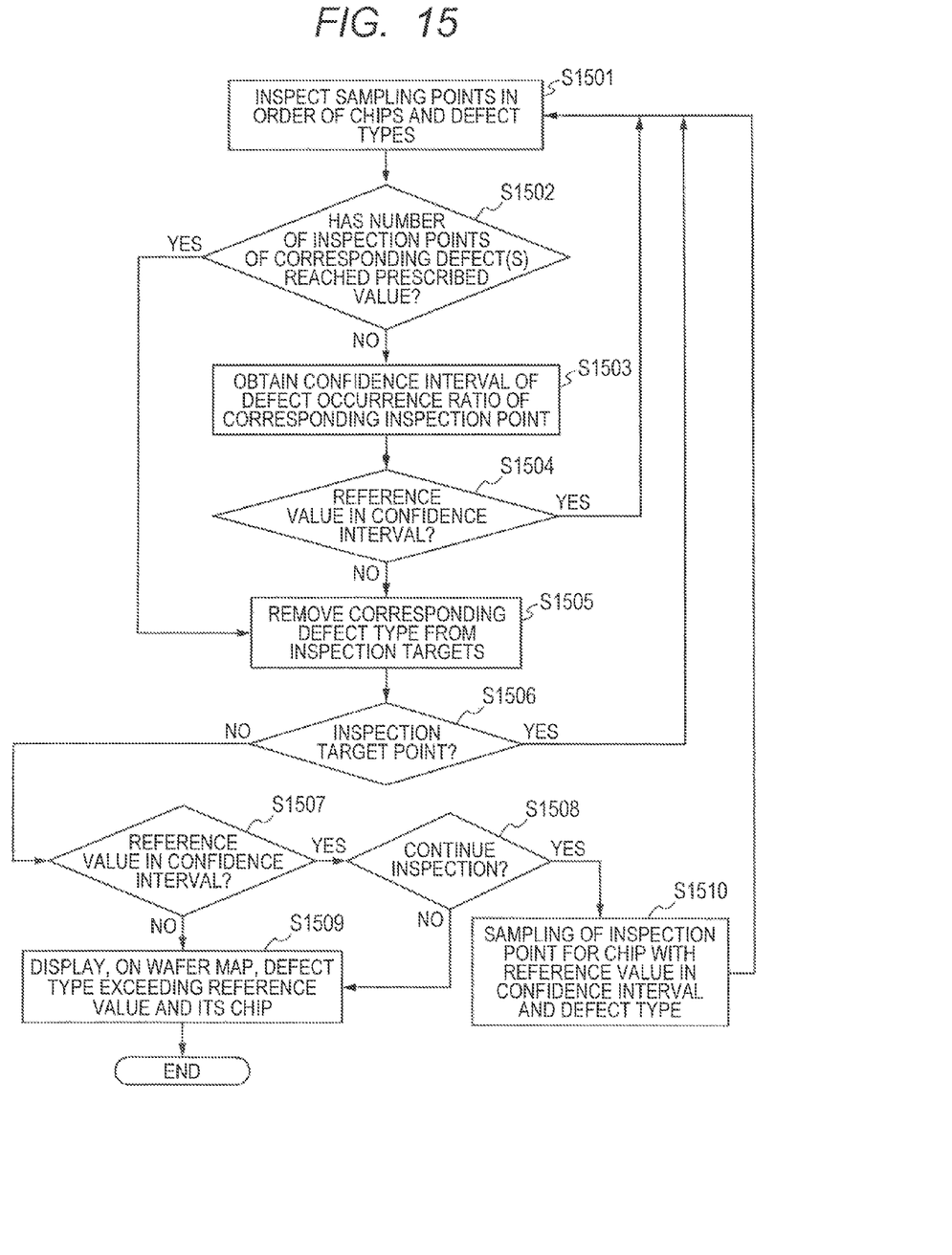
FIG. 15 is a flow diagram illustrating the specific flow of a process from S904 to S906 in the process flow diagram illustrated in FIG. 9 and illustrating the flow of a process when the upper limit is given to the number of inspection points.

In the process flow of FIG. 11, the procedures are repeated until the defect determination is possible. Thus, it is not possible to estimate the number of inspection points and the inspection time. FIG. 15 illustrates a process flow of a method for setting the upper limit of the number of inspection points or inspection time, and continuing and interrupting the inspection based on an operator's determination.

In the process flow of FIG. 15, it is assumed that the inspection is performed cyclically for each chip and the defect type. For example, there are chips of number 1 to number "M", and there are defect types from A to C. In this case, "(m, n)" represents a defect type "n" of the "m-th" chip, and one specific example of the cyclical inspection indicates (1, A), (1, B), (1, C), (2, A) ... (M, B), (M, C), (1, A), (1, B). It also indicates that the same combination of inspection is not performed, if one cycle of combinations of chips and defect types is not done.

In the process flow of the inspection in FIG. 15, in the inspection of S1501, one combination of inspection (for example, an inspection of (1, A)) is performed, and the flow shifts to S1502 thereafter. When returning from S1504, S1506, S1510 back to S1501, a next inspection, that is, a cyclical inspection of (1, B) is performed. Prescribed values are set prior to the inspection, and include a reference value (a threshold value) for the defect ratio acquired in the inspection and the maximum number of the number of inspection points for the defect type of each chip. Following the above example, the inspection order is set with a cyclical list of (1, A), (1, B), (1, C), (2, A) ... (M, B) (M, C) (1, A) (1, B), and the inspection is performed in this order.

An inspection for (1, A) is performed in S1501, and a determination is made as to whether the number of inspected points of (1, A) has reached a prescribed value in S1502. If the number has reached a prescribed value, the flow forwards to S1505 to remove (1, A) from the inspection list. If there are other inspection points (S1506), the flow returns to S1501 to inspect the next inspection point (1, B). If the number of inspected points has not reached a prescribed value, the flow forwards to S1503 to obtain a confidence interval of the defect occurrence ratio of (1, A) and compare between the confidence interval and a reference value (S1504). If a reference value is present in the confidence interval, the flow returns to S1501 to inspect the next point (1, B). If a reference value is not present in the confidence interval, the defect determination is possible. Thus, (1, A) is removed from the inspection list (S1505). If there is any other inspection point (S1506), the flow returns to S1501 to inspect the next inspection point (1, B) (S1506).

Accordingly, if the entire inspection target points are removed from the inspection list, the flow shifts to S1507. If a reference value is not present in the confidence interval for all chips and all defect types, the flow shifts to S1509, in which the inspection result is output. If a reference value is present in the confidence interval, an inquiry as to whether to continue the inspection is given to the operator (S1508). When the inspection is continued, the sampling is performed again for inspection points in a combination of a chip and a defect type, having a reference value in the confidence interval. A cyclical list of the inspections is made again using this combination, and the flow returns to S1501.

When the inspection is interrupted in S1508, the flow forwards to S1509 to display the defect. At this time, there remains some combinations of the chip and the defect type which are not yet able to conduct defect determination. The combination which is not yet conducted defect determination is displayed using a different color from other's. Accordingly, the descriptions have been made in the order from (1, A). After this, the inspection proceeds sequentially in accordance with the cyclical list of (1, B), (1, C), and (2, A).

Accordingly, the descriptions have been made to an example of performing the defect determination based on a comparison between the reference value and the confidence interval of the defect ratio. However, the defect determination may be performed from a comparison of the defect ratios between chips of the same defect type or the defect ratios between defect types within the same chip or in different chips.

As an example of determination result of the comparison, there is considered a comparison between two ratios, that is, the maximum ratio and minimum ratio among a plurality of ratios. In this case, confidence intervals of the two may overlap each other, or may not overlap. If the confidence intervals do not overlap each other, it can be understood that a difference exists between both ratios, that is, a significant difference exists. On the contrary, if the confidence intervals overlap each other, it can be understood that a difference does not exists between both ratios, that is, a significant difference does not exist. If the difference exists, the chip or the defect type having the maximum defect ratio is displayed on the wafer map. For the display, the screens are switched by the defect type, and only corresponding chips are emphasized and displayed in the form as illustrated in FIG. 4.

According to the above-described method, it is possible to efficiently evaluate the frequency of defects occurred at hot spot in a pre-process of semiconductor manufacturing, with a high reliability. Thus, it is possible to perform a solution quickly, such as for changing the manufacturing condition.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

REFERENCE SIGNS LIST

101 . . . tip 102 . . . hot spot 103 . . . hot spot 201 . . . a short defect occurrence estimated area 202 . . . a center coordinate position of the short defect occurrence estimated area 203 . . . an enlarged image of the hot spot 301 . . . a disconnection defect occurrence estimated area 302 . . . the center coordinate of the disconnection defect occurrence estimated area 303 . . . an enlarged image of the hot spot 401 . . . a wafer map schematically showing an inspection target wafer 402 . . . semiconductor chip 501 . . . inspection target chips 601 . . . a defect determination unit 602 . . . a design data server 603 . . . an inspection device 604 . . . LAN 605 . . . a lithography simulator 70 . . . a SEM device body 700 . . . an electron beam 701 . . . an electron source 702 . . . an electron lens 703 . . . an electron lens 704 . . . an electron beam axis adjuster 705,706 . . . deflector stage 707 . . . an objective lens 708 . . . a wafer 709 . . . an imaging target area 710 . . . a reflection plate 711 . . . an electron detector 712 . . . an A/D converter 713 . . . an adding unit 714 . . . memory 715 . . . an image processing unit 716 . . . XY stage 717 . . . secondary storage device 718 . . . a computer 719 . . . an overall control system 720 . . . a current amount control unit 721 . . . a deflection control unit 722 . . . an electron lens control unit 723 . . . a stage control unit 724 . . . a sequence control unit 725 . . . a data input/output I/F 801 . . . a bus 802 . . . a data I/F unit 803 . . . a design data storage unit 804 . . . an inspection point sampling unit 805 . . . a CPU 806 . . . a memory 807 . . . a storage medium 808 . . . a design data pattern position specifying unit 809 . . . a display terminal 810 . . . an input device 811 . . . an external storage medium

What is claimed is:

1. A semiconductor device defect inspection method comprising the steps of:
specifying inspection points by a defect type on design data;
selecting a pre-specified number of inspection points from the specified inspection points, by the defect type;
imaging the pre-specified number of inspection points selected by the defect type, and detecting defects at the inspection points;
calculating a defect ratio of the detected defects with respect to the number of inspection points imaged by the defect type and also a confidence interval of the defect ratio;
comparing the confidence interval of the defect ratio calculated by the defect type with a preset reference value; and
obtaining a defect type having a defect occurrence ratio exceeding the reference value.

2. The semiconductor device defect inspection method according to claim 1, further comprising the steps of: when the preset reference value is included in a range of the calculated confidence interval of the defect ratio by the defect type,
selecting again inspection points for the defect type including the reference value in the range of the confidence interval of the defect ratio;
imaging the re-selected inspection points and detecting defects at the inspection points;
calculating a defect ratio of the defects detected by imaging the re-selected inspection points and a confidence interval of the defect ratio by the defect type;
comparing the calculated confidence interval of the defect ratio by defect type with the preset reference value; and
obtaining a defect type having a defect occurrence ratio exceeding the reference value.

3. The semiconductor device defect inspection method according to claim 1, further comprising the step of
displaying a comparison result of the confidence interval and the reference value by the defect type, on a wafer map.

4. A semiconductor device defect inspection method comprising the steps of:
specifying inspection points by defect type on design data;
selecting a pre-specified number of inspection points by the defect type from the pre-specified number of inspection points;
imaging the selected pre-specified number of inspection points by the defect type, and detecting defects at the inspection points from an image of the inspection points;
calculating a ratio of the defects calculated with respect to the number of inspection points imaged by the defect type;
calculating a significant difference of defect ratios calculated by the defect type, and
obtaining a defect type having a significant difference in the defect ratio based on a calculation result.

5. The semiconductor device defect inspection method according to claim 4, further comprising the steps of:
determining whether to continue inspection by the defect type, based on the significant difference of the obtained defect type;
selecting again the inspection points for the defect type determined to continue inspection, based on a determination result;
imaging the re-selected inspection points, and acquiring an image of the re-selected inspection points;
detecting defects from the acquired image of the re-selected inspection points;
calculating a defect ratio of the defects detected by imaging the re-selected inspection points and a confidence interval of the defect ratio by the defect type;
calculating a significant difference of the calculated defect ratios by the defect type, and extracting a defect type having a significant difference in the defect ratio, based on a calculation result.

6. The semiconductor device defect inspection method according to claim 4, further comprising the step of displaying the significant difference by the defect type on a wafer map.

7. A semiconductor device defect inspection system, comprising:
an inspection point specifying unit which specifies inspection points by defect type on design data;
an input unit which inputs a pre-specified number of inspection points from the inspection points specified by the inspection point specifying unit, by the defect type;
an imaging unit which images the pre-specified number of inspection points by the defect type that are input by the input unit;
an image processing unit which processes an image of the inspection points which is acquired by the imaging unit, and detects defects;
an arithmetic unit which calculates a defect ratio as a ratio of number of defects by the defect type that are detected by the image processing unit with respect to number of inspection points by the defect type imaged by the imaging unit and also a confidence interval of the defect ratio by the defect type;
a comparison unit which compares the confidence interval of the defect ratio calculated by the arithmetic unit by the defect type with a preset reference value;
a defect type extracting unit which obtains a defect type having a defect ratio exceeding the reference value, and
an output unit which outputs information regarding the defect type obtained by the defect type extracting unit.

8. The semiconductor device defect inspection system according to claim 7, wherein; when the preset reference value is included in a range of the confidence interval of the defect ratio by the defect type, as a comparison result by the comparison unit which compares between the confidence interval and the preset reference value by the defect type,
the inspection point specifying unit selects again inspection points for the defect type including the reference value in the range of the confidence interval of the defect ratio;
the imaging unit images the re-selected inspection points;
the image processing unit detects defects at the inspection points from the image of the re-selected inspection points which is imaged by the imaging unit;
the arithmetic unit calculates a defect ratio of the defects detected from the image of the re-selected inspection points by the image processing unit and a confidence interval of the defect ratio by defect type;
the comparison unit compares the confidence interval of the defect ratio by the defect type of the defects detected from the image at the re-selected inspection points with a preset reference value;
the defect type extracting unit obtains a defect type having a defect ratio exceeding the reference value based on a result of comparison by the comparison unit; and
the output unit outputs information regarding the defect type obtained by the defect type extracting unit.

9. The semiconductor device defect inspection system according to claim 7, wherein
the output unit displays a comparison result between the confidence interval and the reference value by the defect type on a wafer map.

10. A semiconductor device defect inspection system comprising:
an inspection point specifying unit which specifies inspection points by defect type on design data;
an input unit which inputs a pre-specified number of inspection points by the defect type, from the inspection points specified by the inspection point specifying unit;
an imaging unit which images the pre-specified number of inspection points by the defect type that are input by the input unit;
an image processing unit which processes the image of the inspection points imaged by the imaging unit, and detects defects;
an arithmetic unit which calculates a defect ratio as a ratio of number of defects, by the defect type, detected by the image processing unit with respect to number of inspection points by the defect type imaged by the imaging unit and also a confidence interval of the defect ratio by the defect type;
a significant difference calculating unit which calculates a significant difference of defect ratios by the defect type calculated by the arithmetic unit;
a defect type extracting unit which obtains a defect type having a significant difference in the defect ratio, based on a calculation result by the significant difference calculating unit; and
an output unit which outputs information regarding the defect type obtained by the defect type extracting unit.

11. The semiconductor device defect inspection system according to claim 10, further comprising
an inspection continuation necessity/non-necessity input unit which inputs necessity or non-necessity of continuation of an inspection by the defect type, based on the significant difference of defect ratios by the defect type calculated by the significant difference calculating unit,
wherein the inspection point specifying unit selects again inspection pints based on a defect type which has been input to be necessarily inspected by the inspection continuation necessity input unit;
the imaging unit images the inspection points selected again by the inspection point specifying unit;
the image processing unit detects defects of the inspection points from the image of the re-selected inspection points imaged by the imaging unit;
the arithmetic unit calculates a defect ratio of the defects detected from the image of the re-selected inspection points by the image processing unit and a confidence interval of the defect ratio by the defect type;
the significant difference calculating unit calculates a significant difference of defect ratios, by the defect type, of the defects detected from the image of the re-selected inspection points, calculated by the arithmetic unit;
the defect type extracting unit extracts a defect type having a significant difference in a defect ratio, based on a calculation result by the significant difference calculating unit, and
the output unit outputs information regarding the defect type having the significant difference in the defect ratio and extracted by the defect type extracting unit.

12. The semiconductor device defect inspection system according to claim 10,
wherein the output unit displays the significant difference calculated by the significant difference calculating unit by the defect type on a wafer map.

* * * * *